(12) United States Patent
Shimizu et al.

(10) Patent No.: US 7,550,204 B2
(45) Date of Patent: Jun. 23, 2009

(54) RESIN COMPOSITION FOR SEALING OPTICAL DEVICE, CURED PRODUCT THEREOF, AND METHOD OF SEALING SEMICONDUCTOR ELEMENT

(75) Inventors: Hisashi Shimizu, Annaka (JP); Toshio Shiobara, Annaka (JP); Tsutomu Kashiwagi, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 432 days.

(21) Appl. No.: 11/586,564

(22) Filed: Oct. 26, 2006

(65) Prior Publication Data
US 2007/0099009 A1    May 3, 2007

(30) Foreign Application Priority Data
Oct. 27, 2005    (JP)    ............... 2005-312504

(51) Int. Cl.
*B32B 9/04*    (2006.01)
*C08G 77/18*    (2006.01)

(52) U.S. Cl. ................... 428/447; 528/16; 528/17; 528/18; 528/43

(58) Field of Classification Search ............ None
See application file for complete search history.

(56) References Cited

U.S. PATENT DOCUMENTS 5,300,610 A * 4/1994 Nakanishi et al. ........... 528/14
2006/0035092 A1    2/2006 Shimizu et al.
2006/0229408 A1    10/2006 Shimizu et al.
2006/0270786 A1    11/2006 Shimizu et al.

FOREIGN PATENT DOCUMENTS

EP    1 223 192 A1    7/2002
JP    10-139964    *    5/1998

OTHER PUBLICATIONS

Machine translation of JP 10-139964, 1998 with accompanying full translation ofparagraphs [0022-24], [0031], [0035].*
U.S. Appl. No. 11/773,143, filed Jul. 3, 2007, Shimizu, et al.

* cited by examiner

*Primary Examiner*—Marc S Zimmer
(74) *Attorney, Agent, or Firm*—Oblon, Spivak, McClelland, Maier & Neustadt, P.C.

(57) ABSTRACT

The present invention provides a composition for sealing an optical device comprising (i) a silylated organopolysiloxane with a polystyrene equivalent weight average molecular weight of $5 \times 10^4$ or greater, represented by an average composition formula:

$$R^1_a(OX)_b SiO_{(4-a-b)/2}$$

(wherein, $R^1$ represents an alkyl group, alkenyl group, or aryl group; X represents a combination of a group represented by a formula —$SiR2R3R^4$ (wherein, $R^E$ to $R^4$ are monovalent hydrocarbon groups), and an alkyl group, alkenyl group, alkoxyalkyl group or acyl group; a represents a number within a range from 1.00 to 1.5; b represents a number that satisfies 0 b 2, and a+b satisfies 1.00 a+b 2), and (ii) a condensation catalyst, as well as a transparent cured product obtained by curing the composition, and a method of sealing a semiconductor element that comprises a step of applying the composition to a semiconductor element, and a step of curing the composition that has been applied to the semiconductor element. The composition can form a coating film that exhibits excellent levels of heat resistance, ultraviolet light resistance, optical transparency, toughness and adhesion.

15 Claims, No Drawings

RESIN COMPOSITION FOR SEALING OPTICAL DEVICE, CURED PRODUCT THEREOF, AND METHOD OF SEALING SEMICONDUCTOR ELEMENT

BACKGROUND OF THE INVENTION

1. Field of the Invention

The present invention relates to an optical material. More specifically, the invention relates to a resin composition for sealing an optical device such as an LED element that exhibits high levels of heat resistance and ultraviolet light resistance, as well as excellent optical transparency and favorable toughness, and also relates to a cured product obtained by curing the composition, and a method of sealing a semiconductor element that uses the composition.

2. Description of the Prior Art

Because of their favorable workability and ease of handling, high transparency epoxy resins and silicone resins are widely used as the sealing materials for optical devices such as LED elements. Recently, LEDs with shorter wavelengths such as blue LEDs and ultraviolet LEDs have been developed, and the potential applications for these short wavelength LEDs are expanding rapidly. Under these circumstances, conventional epoxy resins and silicone resins suffer from various problems, including yellowing of the resin under strong ultraviolet light, or even rupture of the resin skeleton in severe cases, meaning the use of such resins in these applications is problematic. In the case of ultraviolet LED applications, sealing with resins is particularly problematic, meaning sealing with glass is currently the only viable option.

Accordingly, the development of a resin composition which not only retains the excellent levels of heat resistance, toughness and adhesion required of a sealing material, but also resolves the problems described above by exhibiting excellent levels of optical transparency and ultraviolet light resistance, has been keenly anticipated.

SUMMARY OF THE INVENTION

An objective of the present invention is to address the problems described above, and provide a curable resin composition that is useful for sealing optical devices such as LED elements, and which upon curing, is able to form a coating film or the like that exhibits excellent levels of heat resistance, ultraviolet light resistance, optical transparency, toughness and adhesion.

As a result of intensive research aimed at achieving the above objective, the inventors were able to complete the present invention. In other words, a first aspect of the present invention provides a resin composition for sealing an optical device, comprising:

(i) a silylated organopolysiloxane with a polystyrene equivalent weight average molecular weight of $5 \times 10^4$ or greater, represented by an average composition formula (1) shown below:

$$R^1_a(OX)_b SiO_{(4-a-b)/2} \qquad (1)$$

(wherein, each $R^1$ represents, independently, an alkyl group of 1 to 6 carbon atoms, an alkenyl group of 1 to 6 carbon atoms, or an aryl group of 1 to 6 carbon atoms; X represents a combination of a group represented by a formula —$SiR^2R^3R^4$ (wherein, $R^2$, $R^3$ and $R^4$ each represent, independently, an unsubstituted or substituted monovalent hydrocarbon group), and one or more groups selected from amongst alkyl groups, alkenyl groups, alkoxyalkyl groups and acyl groups each having 1 to 6 carbon atoms; a represents a number within a range from 1.00 to 1.5; b represents a number that satisfies 0<b<2, and a+b satisfies 1.00<a+b<2), and (ii) a condensation catalyst.

A second aspect of the present invention provides a transparent cured product obtained by curing the above composition.

A third aspect of the present invention provides a method of sealing a semiconductor element, comprising a step of applying the above composition to a semiconductor element, and a step of curing the composition that has been applied to the semiconductor element.

A fourth aspect of the present invention provides a resin-sealed semiconductor device, comprising a semiconductor element, and a cured product of the above composition that seals the semiconductor element.

A composition of the present invention is very useful for preparing a cured product that exhibits excellent heat resistance, ultraviolet light resistance, optical transparency, toughness and adhesion, and also has a small refractive index. In addition, a composition of the present invention also exhibits excellent storage stability. Accordingly, the composition is particularly useful for sealing optical devices such as LED elements. Moreover, by sealing a semiconductor element using a sealing method that makes use of a composition of the present invention, an optical device that displays the excellent properties listed above can be produced.

DETAILED DESCRIPTION OF THE PREFERRED EMBODIMENTS

As follows is a more detailed description of the present invention. In this description, the term "room temperature" is defined as 24±2° C. Furthermore, the term "polystyrene equivalent weight average molecular weight" refers to a weight average molecular weight determined from a molecular weight distribution obtained by gel permeation chromatography analysis. In those cases where this molecular weight distribution has a distribution profile with 2 or more peaks, the "polystyrene equivalent weight average molecular weight" refers to the weight average value for the peak within the profile that occurs at the highest molecular weight.

<Resin Composition>

A composition of the present invention comprises a component (i) and a component (ii). A detailed description of each of the components included within a composition of the present invention is provided below.

[(i) Silylated Organopolysiloxane]

The component (i) is a silylated organopolysiloxane represented by the above average composition formula (1), and has a polystyrene equivalent weight average molecular weight of $5 \times 10^4$ or greater, and preferably within a range from $1 \times 10^5$ to $6 \times 10^5$, and even more preferably within a range from $2 \times 10^5$ to $5 \times 10^5$. When the organopolysiloxane having the weight average molecular weight of less than $5 \times 10^4$ is mixed with a condensation catalyst described below and used to prepare a coating, the coating is more prone to cracking, and a coating with a thickness of 50 μm or greater may be unobtainable.

In the above average composition formula (1), the alkyl groups, alkenyl groups and aryl groups represented by $R^1$ contain from 1 to 6 carbon atoms. Examples of suitable alkyl groups include a methyl group, ethyl group, propyl group, isopropyl group, butyl group, and isobutyl group. Examples of suitable alkenyl groups include an allyl group and vinyl group. An example of a suitable aryl group is a phenyl group. A methyl group is particularly preferred as the $R^1$ group.

In the above average composition formula (1), $R^2$, $R^3$ and $R^4$ each represent, independently, an unreactive substituted or unsubstituted monovalent hydrocarbon group, which preferably contains from 1 to 6 carbon atoms, and even more preferably from 1 to 3 carbon atoms. Specific examples of suitable hydrocarbon groups include alkyl groups such as a methyl group, ethyl group or propyl group; alkenyl groups such as an allyl group or vinyl group; aryl groups such as a phenyl group; and groups in which either a portion of, or all of, the hydrogen atoms in the above groups have been substituted with halogen atoms. Furthermore, the alkyl groups, alkenyl groups, alkoxyalkyl groups and acyl groups that represent a portion of the X groups all contain from 1 to 6 carbon atoms. Examples of suitable alkyl groups include a methyl group, ethyl group, propyl group, isopropyl group, butyl group, and isobutyl group. Examples of suitable alkenyl groups include an allyl group and vinyl group. Examples of suitable alkoxyalkyl groups include a methoxyethyl group, ethoxyethyl group, and butoxyethyl group. Examples of suitable acyl groups include an acetyl group and propionyl group.

In the above average composition formula (1), the relative proportions within the X groups of [the groups represented by the formula —$SiR^2R^3R^4$ (wherein, $R^2$, $R^3$ and $R^4$ are as defined above)] and the [one or more groups selected from amongst alkyl groups, alkenyl groups, alkoxyalkyl groups and acyl groups each having 1 to 6 carbon atoms] (in other words, the ratio [groups represented by the formula —$SiR^2R^3R^4$]: [groups selected from amongst alkyl groups, alkenyl groups, alkoxyalkyl groups and acyl groups each having 1 to 6 carbon atoms]) is preferably a molar ratio within a range from 1:1 to 8:1, and even more preferably from 2:1 to 4:1. When this ratio satisfies this range, a composition with excellent curability is obtained, and the cured product obtained by curing the composition exhibits favorable coating properties such as adhesion.

In the above average composition formula (1), a is a number within a range from 1.00 to 1.5, and preferably from 1.05 to 1.3, and even more preferably from 1.1 to 1.2, whereas b is a number that satisfies 0<b<2, and is preferably a number within a range from 0.01 to 1.0, and even more preferably from 0.05 to 0.3. If the value of a is less than 1.00, then the obtained coating may be more prone to cracking. If the value of a exceeds 1.5, then the obtained coating may lose toughness, and may be more prone to becoming brittle. If b is zero, then the adhesion of the obtained coating to substrates may deteriorate, whereas if b is 2 or greater, then a cured coating may be unobtainable. Furthermore, the value of a+b is a number that satisfies 1.00<a+b<2, and is preferably a number within a range from 1.00 to 1.5, and even more preferably from 1.1 to 1.3.

Furthermore, in order to ensure a more superior level of heat resistance for the cured product, the (mass referenced) proportion of $R^1$ groups (typically methyl groups) within the silylated organopolysiloxane of the component (i) is preferably reduced. Specifically, this proportion is preferably restricted to 32% by mass or lower, and is typically restricted to a value within a range from 15 to 30% by mass, and even more typically from 20 to 27% by mass. The silylated organopolysiloxane of the component (i) may be either a single compound, or a combination of two or more different compounds. In those cases where the composition is used in an application that involves irradiation with UV light, the inclusion of aryl groups such as phenyl groups within the silylated organopolysiloxane of the component (i) may accelerate UV deterioration of the composition. As a result, the groups $R^1$ and X in the above average composition formula (1), and groups $R^5$ and $R^6$ in a general formula (2) described below are preferably not aryl groups such as a phenyl group.

Production Method

The silylated organopolysiloxane of the component (i) may be produced using any appropriate method, and one suitable method involves silylating an organopolysiloxane obtained from a typical hydrolysis-condensation.

Method of Producing Organopolysiloxane that is to Undergo Silylation

The organopolysiloxane that is to undergo silylation can be produced, for example, by hydrolysis and condensation of a silane compound having a hydrolyzable group, and is preferably produced either by hydrolysis and condensation of a silane compound (c=1 to 3) or silicate (c=0) represented by a general formula (2) shown below:

$$SiR^5_c(OR^6)_{4-c} \qquad (2)$$

[wherein, each $R^5$ represents, independently, a group as defined above for $R^1$, each $R^6$ represents, independently, a group as defined above for X with the exception of the groups represented by the formula —$SiR^2R^3R^4$ (that is, an alkyl group, alkenyl group, alkoxyalkyl group or acyl group each having 1 to 6 carbon atoms), and c represents an integer of 0 to 3), or by hydrolysis and condensation of a condensation polymerization product of the silicate (that is, a polysilicate) (hereafter the term "(poly)silicate" is used to refer jointly to silicate and polysilicate). The silane compound having a hydrolyzable group preferably comprises solely a silane compound (c=1 to 3) represented by the above general formula (2), but may also be a combination of the silane compound (c=1 to 3) represented by the above general formula (2) and the aforementioned (poly)silicate. These silane compounds represented by the above general formula (2) and the (poly)silicates may be used either alone, or in combinations of two or more different compounds.

Examples of the silane compounds represented by the above general formula (2) include organotrialkoxysilanes such as methyltrimethoxysilane, methyltriethoxysilane, ethyltrimethoxysilane, ethyltriethoxysilane, phenyltrimethoxysilane, and phenyltriethoxysilane; diorganodialkoxysilanes such as dimethyldimethoxysilane, dimethyldiethoxysilane, diphenyldimethoxysilane, diphenyldiethoxysilane, methylphenyldimethoxysilane and methylphenyldiethoxysilane; and triorganoalkoxysilanes such as trimethylmethoxysilane, trimethylethoxysilane, triethylmethoxysilane, triethylethoxysilane, triphenylmethoxysilane, and triphenylethoxysilane.

Examples of the silicates represented by the above general formula (2) include tetraalkoxysilanes (namely, alkyl silicates) such as tetramethoxysilane, tetraethoxysilane and tetraisopropyloxysilane.

Examples of particularly preferred silane compounds (c=1 to 3) and silicates (c=0) represented by the above general formula (2) include methyltrimethoxysilane and dimethyldimethoxysilane. Examples of the aforementioned polysilicates include condensation polymerization products of alkyl silicates (alkyl polysilicates) such as methyl polysilicate and ethyl polysilicate.

The above silane compound having a hydrolyzable group preferably comprises a total of at least 50 mol %, and preferably from 70 to 95 mol %, and even more preferably from 75 to 85 mol %, of a silane compound containing 3 hydrolyzable groups within each molecule (that is, a silane compound in which c=1 in the case of the silane compounds represented by the above general formula (2)). Specific examples of the silane compounds containing 3 hydrolyzable groups within each molecule include organotrihydrocarbyloxysilanes such as the organotrialkoxysilanes listed above. The silane compound containing 3 hydrolyzable groups within each molecule is preferably an organotrialkoxysilane.

In order to ensure a cured product that has particularly superior levels of crack resistance and heat resistance, the organopolysiloxane that is to undergo silylation is preferably produced using from 50 to 100 mol % of an organotrialkoxysilane such as methyltrimethoxysilane and from 50 to 0 mol % of a diorganodialkoxysilane such as dimethyldimethoxysilane, and is even more preferably produced using from 75 to 85 mol % of an organotrialkoxysilane such as methyltrimethoxysilane and from 25 to 15 mol % of a diorganodialkoxysilane such as dimethyldimethoxysilane.

Method of Producing Organopolysiloxane that is to Undergo Silylation (a Preferred Embodiment)

In a preferred embodiment of the present invention, the organopolysiloxane that is to undergo silylation can be obtained by subjecting a silane compound having a hydrolyzable group to a two-stage hydrolysis and condensation reaction that includes a first hydrolysis and condensation, and a second hydrolysis and condensation. For example, the conditions described below can be used.

Specifically, the organopolysiloxane can be produced by a method that comprises the steps of:

(i) obtaining an organopolysiloxane by subjecting a silane compound having a hydrolyzable group to a first hydrolysis and condensation (step (i)), and (ii) subjecting the resulting organopolysiloxane to an additional second hydrolysis and condensation (step (ii)).

Details of the silane compound having a hydrolyzable group that is used as a starting raw material in the step (i) are as described above in the section relating to silane compounds having a hydrolyzable group.

The hydrolysis and condensation of the silane compound having a hydrolyzable group within the above step (i) can be conducted using typical methods, but is preferably conducted in the presence of an acid catalyst such as acetic acid, hydrochloric acid or sulfuric acid. In those cases where an acid catalyst is used, the quantity of that acid catalyst is typically adjusted to provide from 0.0001 to 0.01 mols, and preferably from approximately 0.0005 to 0.005 mols of acid per 1 mol of the combined total of all the hydrolyzable groups within the silane compound having a hydrolyzable group. Provided the quantity of acid satisfies this range, a hydrolysis-condensation product with a suitable molecular weight can be obtained.

The quantity of water added during the hydrolysis and condensation of the step (i) is typically within a range from 0.9 to 1.5 mols, and preferably from 1.0 to 1.2 mols, per 1 mol of the combined total of all the hydrolyzable groups (typically hydrocarbyloxy groups such as alkoxy groups) within the silane compound having a hydrolyzable group. When the quantity of water satisfies this range from 0.9 to 1.5 mols, the resulting composition exhibits excellent workability, and the cured product of the composition exhibits excellent toughness.

The above silane compound having a hydrolyzable group is typically dissolved in an organic solvent such as an alcohol, ketone, ester, cellosolve or aromatic compound prior to use. Examples of preferred organic solvents include alcohols such as methanol, ethanol, isopropyl alcohol, isobutyl alcohol, n-butanol and 2-butanol. Of these, isobutyl alcohol is particularly preferred as it produces superior curability for the resulting composition, and excellent toughness for the obtained cured product.

The reaction temperature for the hydrolysis and condensation of the step (i) is preferably within a range from 40 to 120° C., and even more preferably from 60 to 80° C. When the reaction temperature satisfies this range, a hydrolysis-condensation product with a molecular weight that is suitable for use in the following step can be obtained without any gelling.

In this manner, an organopolysiloxane that represents the target product of the step (i) is obtained. In those cases where the aforementioned organic solvent is used, this organopolysiloxane is obtained in the form of a solution. This organopolysiloxane may either be used in the step (ii) in solution form, or the solvent may be removed by evaporation, and the resulting non-volatile fraction then used in the step (ii). Usually, the organopolysiloxane supplied to the step (ii) preferably includes a volatile fraction, comprising the solvent and the like, of at least 5% by mass, and preferably from 10 to 35% by mass. If this volatile fraction is less than 5% by mass, then the organopolysiloxane may become more prone to gelling, whereas if the volatile fraction exceeds 35% by mass, the reactivity may deteriorate.

The polystyrene equivalent weight average molecular weight of the organopolysiloxane obtained in the step (i) is preferably within a range from $5 \times 10^3$ to $6 \times 10^4$, even more preferably from $1 \times 10^4$ to $5 \times 10^4$, and is most preferably from $2 \times 10^4$ to $4 \times 10^4$. When the weight average molecular weight satisfies this range, the molecular weight of the organopolysiloxane is more readily increased in the step (ii), meaning an organopolysiloxane with the desired high molecular weight can be obtained.

The step (ii) involves subjecting the organopolysiloxane obtained in the step (i) to an additional second hydrolysis and condensation.

This second hydrolysis and condensation is preferably conducted in the presence of an anion exchange resin, which functions as a hydrolysis-condensation catalyst. A polystyrene-based anion exchange resin is preferred as this anion exchange resin. This anion exchange resin may be either a single exchange resin, or a combination of two or more different resins. Examples of ideal polystyrene-based anion exchange resins include the Diaion series of products (manufactured by Mitsubishi Chemical Corporation). Specific examples of these products include the Diaion SA series (SA10A, SA11A, SA12A, NSA100, SA20A, and SA21A), the Diaion PA series (PA308, PA312, PA316, PA406, PA412, and PA418), the Diaion HPA series (HPA25), and the Diaion WA series (WA10, WA20, WA21J, and WA30).

Of the above anion exchange resins, moisture-containing polystyrene-based anion exchange resins having a molecular structure represented by a structural formula (3) shown below are preferred,

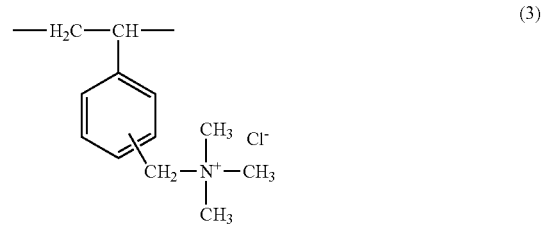

(3)

and polystyrene-based anion exchange resins that contain from 30 to 70% by mass, and particularly from 40 to 50% by mass, of moisture within the resin are particularly preferred. Of the specific product examples listed above, SA10A is a polystyrene-based anion exchange resin that has a molecular structure represented by the above structural formula (3) and also contains 43 to 47% by mass of moisture within the resin, and is consequently particularly favorable. When an anion exchange resin such as a moisture-containing polystyrene-based anion exchange resin or the like is used, the action of the moisture within the catalyst causes the reaction to proceed. The most typical moisture-containing polystyrene-based anion exchange resins are gel-type ion exchange resins, in which the interior of the resin particles is comprised of uniform cross-linked polymers, and which have a transparent external appearance. Within the interior of the resin particles, the cross-linked polymers generate a uniform network-type structure, and water and the like can diffuse freely into the interior of the particles by passing through the gaps within this network structure. In those cases where a moisture-containing anion exchange resin is not used, water must be added separately. In such cases, water is preferably added in a quantity that is sufficient to generate a proportion of 30 to 70% by mass within the resin. In those cases where water is either absent or present in overly small quantities, the basicity of the anion exchange resin weakens, which may cause a deterioration in the reactivity. By ensuring the presence of a suitable proportion of moisture as described above, the basicity of the anion exchange resin can be strengthened, enabling the reaction to proceed favorably.

The quantity used of this anion exchange resin is typically within a range from 1 to 50% by mass, and preferably from 5 to 30% by mass, relative to the non-volatile fraction of the organopolysiloxane that represents the starting material for the step (ii). When the quantity of the anion exchange resin satisfies this range, the reaction rate of the hydrolysis and condensation of the step (ii) is favorable, and the resulting organopolysiloxane that is to undergo silylation is more stable.

The reaction temperature for the hydrolysis and condensation of the step (ii) is preferably within a range from 0 to 40° C., and even more preferably from 15 to 30° C., as such temperatures allow the reaction to proceed favorably. When the reaction temperature satisfies this range, the reaction rate is favorable, and the resulting organopolysiloxane that is to undergo silylation is more stable.

The hydrolysis and condensation of the step (ii) is preferably conducted within a solvent, and the reaction is preferably conducted under conditions in which the concentration of the organic solid components within the solvent is within a range from 50 to 95% by mass, and even more preferably from 65 to 90% by mass. When the concentration satisfies this range, the reaction rate is favorable, and the resulting organopolysiloxane that is to undergo silylation is more stable.

There are no particular restrictions on the organic solvent used in the step (ii), although a solvent with a boiling point of 64° C. or higher is preferred. Specific examples of suitable solvents include hydrocarbon-based solvents such as benzene, toluene, and xylene; ether-based solvents such as tetrahydrofuran, 1,4-dioxane, and diethyl ether; ketone-based solvents such as methyl ethyl ketone; halogen-based solvents such as chloroform, methylene chloride, and 1,2-dichloroethane; alcohol-based solvents such as methanol, ethanol, isopropyl alcohol, and isobutyl alcohol; octamethylcyclotetrasiloxane and hexamethyldisiloxane; as well as solvents with boiling points of 150° C. or higher such as cellosolve acetate, cyclohexanone, butyl cellosolve, methyl carbitol, carbitol, butyl carbitol, diethyl carbitol, cyclohexanol, diglyme, and triglyme; and of these, xylene, isobutyl alcohol, diglyme, and triglyme are preferred, and isobutyl alcohol is particularly desirable. The organic solvent may use either a single compound or a combination of two or more different compounds.

In this manner, an organopolysiloxane that is to undergo silylation, which represents the target product of the step (ii), is obtained. This organopolysiloxane that is to undergo silylation has a polystyrene equivalent weight average molecular weight that is preferably $5 \times 10^4$ or greater, and is typically within a range from $1 \times 10^5$ to $6 \times 10^5$, and even more typically from $2 \times 10^5$ to $5 \times 10^5$. In those cases where the hydrolysis and condensation of the step (ii) is conducted within a solvent, the organopolysiloxane that is to undergo silylation is obtained in the form of a solution. The organopolysiloxane may either be supplied to the silylation in solution form, or the solvent may be removed by distillation, and the resulting non-volatile fraction then used in the silylation. However, in a state where the solvent has been removed, the organopolysiloxane exhibits a strong tendency to undergo gelling, and is therefore preferably stored in solution form from the viewpoint of storage stability, and is most preferably stored in solution form at a temperature of 5° C. or lower.

Silylation of Organopolysiloxane

The aforementioned organopolysiloxane that is to undergo silylation, which can be prepared by any of the above-described methods, has a high molecular weight, and is consequently prone to gelling via condensation of any residual hydroxyl groups within the molecule. Accordingly, by silylating (namely, conducting a silylation reaction of) any residual hydroxyl groups within the organopolysiloxane, the organopolysiloxane can be stabilized. The reaction temperature for this silylation reaction is typically within a range from 0 to 150° C., and preferably from 0 to 60° C.

One example of a method of conducting the silylation reaction is a method in which the aforementioned organopolysiloxane is reacted with a compound that contains a silyl group bonded to an unreactive substituent group. Specific examples include: a method in which the organopolysiloxane is reacted with a trialkylhalosilane; a method that uses a nitrogen-containing silylation agent such as a hexaalkyldisilazane, an N,N-diethylaminotrialkylsilane, an N-(trialkylsilyl)acetamide, an N-methyl(trialkylsilyl)acetamide, an N,O-bis(trialkylsilyl)acetamide, an N,O-bis(trialkylsilyl)carbamate, or an N-trialkylsilylimidazole; a method in which the organopolysiloxane is reacted with a trialkylsilanol; and a method in which the organopolysiloxane is reacted with a hexaalkyldisiloxane in the presence of a weak acid. In those cases where a trialkylhalosilane is used, a base may also be added to neutralize the hydrogen halide that is generated as a by-product. In those cases where a nitrogen-containing silylation agent is used, a catalyst such as trimethylchlorosilane or ammonium sulfate may also be added. A method that uses trimethylchlorosilane as the silylation agent, in the presence of triethylamine, is particularly favorable.

The silylation reaction may be either conducted within a solvent, or conducted without using a solvent. In those cases where a solvent is used, examples of suitable solvents include aromatic hydrocarbon solvents such as benzene, toluene, and xylene; aliphatic hydrocarbon solvents such as hexane and heptane; ether-based solvents such as diethyl ether and tetrahydrofuran; ketone-based solvents such as acetone and methyl ethyl ketone; ester-based solvents such as ethyl acetate and butyl acetate; halogenated hydrocarbon solvents such as chloroform, trichloroethylene, and carbon tetrachloride; dimethylformamide; and dimethyl sulfoxide.

In this manner, a silylated organopolysiloxane that is the objective of the present invention, represented by the above average composition formula (1), and with a polystyrene equivalent weight average molecular weight of $5 \times 10^4$ or greater, and typically within a range from $1\times10^5$ to $6\times10^5$, and even more typically from $2\times10^5$ to $5\times10^5$, can be obtained. In those cases where the silylation reaction is conducted within a solvent, the silylated organopolysiloxane is obtained in the form of a solution. The solution may either be stored and/or used in solution form, or the solvent may be removed by distillation, and the resulting non-volatile fraction then stored and/or used.

[(ii) Condensation Catalyst]

The condensation catalyst of the component (ii) is necessary to enable curing of the silylated organopolysiloxane of the component (i). There are no particular restrictions on this condensation catalyst, and suitable catalysts include organometallic catalysts, Lewis acids, and aluminum compounds. From the viewpoints of achieving favorable stability for the silylated organopolysiloxane, and achieving excellent levels of hardness and resistance to yellowing for the obtained cured product, an organometallic catalyst is normally used. Examples of this organometallic catalyst include compounds that contain metal atoms such as zinc, aluminum, titanium, tin, and/or cobalt, and catalysts that contain tin, zinc, aluminum or titanium atom, or a combination of two or more of these atoms, are preferred. Examples of preferred organometallic catalysts include organic acid zinc compounds, organoaluminum compounds, organotitanium compounds, organic acid tin compounds, and organic acid cobalt compounds, and specific examples include zinc octoate, zinc benzoate, zinc p-tert-butylbenzoate, zinc laurate, zinc stearate, aluminum triisopropoxide, aluminum acetylacetonate, acetylacetone-modified aluminum compounds, aluminum butoxybis(ethylacetoacetate), tetrabutyl titanate, tetraisopropyl titanate, tin octoate, cobalt naphthenate, and tin naphthenate. Of these, aluminum acetylacetonate and acetylacetone-modified aluminum compounds (such as the commercially available product "Acetope Al-MX3", manufactured by Hope Chemical Co., Ltd.) are particularly favorable. Specific examples of the aforementioned Lewis acids that can be used as the condensation catalyst include boron trifluoride and antimony pentafluoride. Furthermore, specific examples of the aforementioned aluminum compounds that can be used as the condensation catalyst include aluminum chloride, aluminum perchlorate, and aluminum phosphate.

The quantity added of the condensation catalyst is preferably within a range from 0.05 to 10 parts by mass, and even more preferably from 0.1 to 5 parts by mass, per 100 parts by mass of the silylated organopolysiloxane of the component (i). When the quantity of the condensation catalyst satisfies this range, the resulting composition exhibits more favorable curability, and is stable. The condensation catalyst of the component (ii) may use either a single compound, or a combination of two or more different compounds.

[Other Optional Components]

In addition to the component (i) and component (ii) described above, other optional components may also be added to a composition of the present invention, provided the addition of these other components does not impair the actions or effects of the present invention. Examples of these other optional components include inorganic fillers, inorganic phosphors, age resistors, radical inhibitors, ultraviolet absorbers, adhesion improvers, flame retardants, surfactants, storage stability improvers, antiozonants, photostabilizers, thickeners, plasticizers, coupling agents, antioxidants, thermal stabilizers, conductivity imparting agents, antistatic agents, radiation blockers, nucleating agents, phosphorus-based peroxide decomposition agents, lubricants, pigments, metal deactivators, physical property modifiers, and organic solvents. These optional components may be used either alone, or in combinations of two or more different materials.

Blending an inorganic filler into the composition can have a number of effects, including ensuring that the light scattering properties of the resulting cured product and the flowability of the composition fall within suitable ranges, and reinforcing the materials generated using the composition. There are no particular restrictions on the inorganic filler, although very fine particulate fillers that cause no deterioration in the optical characteristics are preferred, and suitable examples include alumina, aluminum hydroxide, fused silica, crystalline silica, ultra fine amorphous silica powder, ultra fine hydrophobic silica powder, talc, calcium carbonate, and barium sulfate.

Examples of suitable inorganic phosphors include the types of materials that are widely used in LEDs, such as yttrium aluminum garnet (YAG) phosphors, ZnS phosphors, $Y_2O_2S$ phosphors, red light emitting phosphors, blue light emitting phosphors, and green light emitting phosphors.

[Preparation of the Composition]

In the simplest embodiment of the present invention, the composition of the present invention comprises the component (i) and the component (ii), but contains no inorganic fillers such as silica fillers, and is a composition that comprises essentially only the component (i) and the component (ii). In this description, the expression "comprises essentially only" means that the combined quantity of components other than the component (i) and the component (ii) represents less than 1% by mass, particularly less than 0.1% by mass of the entire composition.

The composition of the present invention can be prepared by mixing together the aforementioned components (i) and (ii), together with any optional components that are to be added, using any arbitrary mixing method. In a specific example, the component (i), the component (ii), and any optional components that are to be added are placed in a commercially available mixer (such as a Thinky Conditioning Mixer (manufactured by Thinky Corporation)), and are mixed together uniformly for approximately 1 to 5 minutes, thereby yielding the composition of the present invention.

The composition of the present invention may either be molded into a film in a solventless state, or may be dissolved in an organic solvent to form a varnish. There are no particular restrictions on the solvent used, and examples of suitable solvents include the same solvents as those listed above as suitable solvents for the hydrolysis and condensation of the aforementioned step (ii).

[Preparation of a Cured Product]

A transparent cured product can be prepared by curing the above composition. Although there are no particular restrictions on the thickness of this cured product, the lower limit for the thickness is preferably 10 μm and even more preferably 50 μm, whereas the upper limit for the thickness is preferably 3 mm (3,000 μm) and even more preferably 1 mm (1,000 μm). In other words, the thickness is typically within a range from 10 μm to 3 mm, and preferably from 50 μm to 1 mm.

In terms of curing conditions, although the above composition may be cured by simply heating at a temperature of 25 to 180° C. for a period of approximately 1 to 12 hours, curing is preferably conducted in a stepwise manner (with multiple stages) within a range from 25 to 180° C. Stepwise curing can be conducted using either two, or three or more stages, and is preferably conducted using the three stages described below. First, the composition is subjected to low temperature curing at a temperature of 25 to 60° C. The curing time for this stage is typically within a range from approximately 0.5 to 2 hours. Subsequently, the low temperature-cured composition is heat cured at a temperature of 60 to 120° C. The curing time for this stage is typically within a range from approximately 0.5 to 2 hours. Finally, the heat-cured composition is subjected to further heat curing at a temperature of 150 to 180° C. The curing time for this stage is typically within a range from approximately 1 to 10 hours. More specifically, the composition is preferably subjected to low temperature curing at 60° C. for 1 hour, subsequently subjected to heat curing at 100° C. for 1 hour, and then subjected to further heat curing at 150° C. for 8 hours. By using a stepwise curing process that includes these stages, the cured state of the cured product becomes more favorable, and foaming is able to be suitably suppressed. Moreover, by using a stepwise curing process, a colorless and transparent cured product with a thickness that falls within the above range can be obtained. In particular, a stepwise curing process that includes heat curing at a temperature of 100° C. or higher can be used to prepare a cured product with a thickness of 10 μm to 3 mm. Furthermore, by using the above type of stepwise curing process, curing proceeds in accordance with the difference in reactivity between the residual silyl groups and alkoxy groups and the like, meaning curing strain (internal stress) within the resulting cured product can be favorably reduced.

A cured product produced by curing a composition of the present invention exhibits a high level of strength, as well as favorable flexibility and adhesion. Furthermore, a composition of the present invention can be used to form thick films (for example, with a thickness of 50 μm or greater).

The glass transition temperature (Tg) of the cured product obtained by curing a composition of the present invention is usually too high to enable measurement using a commercially available measuring device (such as the thermomechanical tester (product name: TM-7000, measurement range: 25 to 200° C.) manufactured by Shinku Riko Co., Ltd.), indicating that the cured product exhibits an extremely high level of heat resistance.

[Applications of the Composition]

A composition of the present invention is useful for sealing optical devices such as LED elements, and is particularly useful for sealing blue LED and ultraviolet LED elements. Because a composition of the present invention also exhibits excellent levels of heat resistance, ultraviolet light resistance, and transparency, it can also be used in a variety of other applications described below, including display materials, optical recording materials, materials for optical equipment and optical components, optical fiber materials, photoelectronic organic materials, and peripheral materials for semiconductor integrated circuits.

1. Display Materials

Examples of display materials include peripheral materials for liquid crystal display devices, including substrate materials for liquid crystal displays, optical waveguides, prism sheets, deflection plates, retardation plates, viewing angle correction films, adhesives, and polarizer protection films; sealing materials, anti-reflective films, optical correction films, housing materials, front glass protective films, substitute materials for the front glass, and adhesives and the like for the new generation, flat panel, color plasma displays (PDP); substrate materials, optical waveguides, prism sheets, deflection plates, retardation plates, viewing angle correction films, adhesives, and polarizer protection films and the like for plasma addressed liquid crystal (PALC) displays; front glass protective films, substitute materials for the front glass, and adhesives and the like for organic EL (electroluminescence) displays; and various film substrates, front glass protective films, substitute materials for the front glass, and adhesives and the like for field emission displays (FED).

2. Optical Recording Materials

Examples of optical recording materials include disk substrate materials, pickup lenses, protective films, sealing materials, and adhesives and the like used for VD (video disks), CD, CD-ROM, CD-R/CD-RW, DVD±R/DVD±RW/DVD-RAM, MO, MD, PD (phase change disk), or optical cards.

3. Materials for Optical Equipment

Examples of materials for optical instruments include lens materials, finder prisms, target prisms, finder covers, and light-receiving sensor portions and the like for steel cameras; lenses and finders and the like for video cameras; projection lenses, protective films, sealing materials, and adhesives and the like for projection televisions; and lens materials, sealing materials, adhesives, and films and the like for optical sensing equipment.

4. Materials for Optical Components

Examples of materials for optical components include fiber materials, lenses, waveguides, element sealing materials and adhesives and the like around optical switches within optical transmission systems; optical fiber materials, ferrules, sealing materials and adhesives and the like around optical connectors; sealing materials and adhesives and the like for passive fiber optic components and optical circuit components such as lenses, waveguides and LED elements; and substrate materials, fiber materials, element sealing materials and adhesives and the like around optoelectronic integrated circuits (OEIC).

5. Optical Fiber Materials

Examples of optical fiber materials include illumination light guides and the like for decorative displays; industrial sensors, displays and indicators and the like; and optical fiber for transmission infrastructure or household digital equipment connections.

6. Peripheral Materials for Semiconductor Integrated Circuits

Examples of peripheral materials for semiconductor integrated circuits include resist materials for microlithography for generating LSI or ultra LSI materials.

7. Photoelectronic Organic Materials

Examples of photoelectronic organic materials include peripheral materials for organic EL elements; organic photorefractive elements; optical-optical conversion devices such as optical amplification elements, optical computing elements, and substrate materials around organic solar cells; fiber materials; and sealing materials and adhesives and the like for use with the above types of elements.

[Method of Sealing Semiconductor Elements]

A semiconductor element such as a LED element can be sealed using a cured product of a composition of the present invention. Specifically, a semiconductor element can be sealed using a method that comprises the steps of: applying the composition of the present invention to the semiconductor element, and curing the composition that has been applied to the semiconductor element. Application of the composition may be conducted either using a varnish that includes the aforementioned organic solvent, or using a composition that contains no solvent. Furthermore, the application may be conducted by a coating method or immersion method, including spin coating method, roll coating method, flow coating method, knife coating method, and squeegee coating method. The applied composition can be cured, for example, using the stepwise curing process described above.

[Resin-Sealed Semiconductor Device]

A resin-sealed semiconductor device of the present invention comprises a semiconductor element, and a cured product of the above composition that seals the semiconductor element.

Examples of semiconductor elements that can be sealed with a cured product of the above composition include light emitting diodes, photodiodes, CCD, CMOS, image sensors, phototransistors, IR sensors, and laser diodes.

The thickness of the cured product of the composition used for sealing the above semiconductor element may be any thickness within a range from 10 μm to 3 mm (3,000 μm), and thickness values within a range from approximately 50 μm to 1 mm (1,000 μm) are particularly favorable.

EXAMPLES

As follows is a more detailed description of the present invention using a series of examples, although the present invention is in no way limited by these examples. The methyltrimethoxysilane used in the synthesis examples is KBM13 (a product name) manufactured by Shin-Etsu Chemical Co., Ltd., and the dimethyldimethoxysilane is KBM22 (a product name), also manufactured by Shin-Etsu Chemical Co., Ltd.

Synthesis Example 1

A 1 L three-neck flask was fitted with a stirrer and a condenser tube. The flask was then charged with 109 g (0.8 mols) of methyltrimethoxysilane, 24 g (0.2 mols) of dimethyldimethoxysilane, and 106 g of isobutyl alcohol, and the mixture was cooled in ice with constant stirring. With the temperature inside the system maintained at 0 to 20° C., 60.5 g of 0.05 N hydrochloric acid solution was added dropwise. Following completion of the dropwise addition, the resulting reaction mixture was stirred for 11 hours at a reflux temperature of 80° C. Subsequently, the resulting reaction liquid was cooled to room temperature, and 150 g of xylene was added to dilute the reaction liquid. This diluted reaction liquid was then poured into a separating funnel, and washed repeatedly with 300 g samples of water until the electrical conductivity of the separated wash water fell to a value of 2.0 μS/cm or lower. The water was then removed from the washed reaction liquid by azeotropic dehydration, and the volatile fraction was adjusted to 30% by mass, thereby yielding 113 g of a solution (that included some organic solvent and had a non-volatile fraction of 70% by mass) of an organopolysiloxane A with a polystyrene equivalent weight average molecular weight of 24,000, represented by a formula (4) shown below:

$$(CH_3)_{1.2}(OX)_{0.25}SiO_{1.28} \quad (4)$$

(wherein, X represents a combination of groups in which the ratio (molar ratio) of hydrogen atoms : methyl groups : isobutyl groups=6.1:1.1:1.1).

Subsequently, the 113 g of the solution of the obtained organopolysiloxane A (that included some organic solvent and had a non-volatile fraction of 70% by mass) and 15.8 g of a polystyrene-based anion exchange resin (product name: Diaion SA10A, manufactured by Mitsubishi Chemical Corporation, moisture content: 43 to 47% by mass) were placed in a flask, and the resulting mixture was reacted by stirring for 72 hours at room temperature. Following completion of this 72 hour reaction, 27 g of xylene was added to the reaction mixture, and the mixture was then filtered, yielding 135 g of a solution (that included some organic solvent and had a non-volatile fraction of 57% by mass) of an organopolysiloxane B with a polystyrene equivalent weight average molecular weight of 210,000, represented by a formula (5) shown below:

$$(CH_3)_{1.2}(OX)_{0.12}SiO_{1.34} \quad (5)$$

(wherein, X represents a combination of groups in which the ratio (molar ratio) of hydrogen atoms : methyl groups : isobutyl groups=5.1:1.1:1.0).

The 135 g of the solution of the obtained organopolysiloxane B (that included some organic solvent and had a non-volatile fraction of 57% by mass), 36 g of triethylamine, and 120 g of xylene were combined in a flask, and with the mixture undergoing constant stirring, 26 g of trimethylsilyl chloride was added dropwise at a temperature of 25 to 60° C. Following completion of the dropwise addition, the resulting mixture was reacted for 2 hours at room temperature, and 200 g of water was then added dropwise to the reaction mixture. Subsequently, the reaction mixture was poured into a separating funnel, and the organic phase was separated and then washed repeatedly with 200 g samples of water until the electrical conductivity of the separated wash water fell to a value of 2.0 μS/cm or lower. The water was then removed from the washed reaction liquid by azeotropic dehydration, and the reaction liquid was filtered and stripped of solvent, yielding 71 g of a solution (that included some organic solvent and had a non-volatile fraction of 92% by mass) of a silylated organopolysiloxane C with a polystyrene equivalent weight average molecular weight of 220,000, represented by a formula (6) shown below:

$$(CH_3)_{1.2}(OX)_{0.10}SiO_{1.35} \quad (6)$$

(wherein, X represents a combination of groups in which the ratio (molar ratio) of groups represented by $-Si(CH_3)_3$ : methyl groups: isobutyl groups=5.0:1.0:1.0).

Synthesis Example 2

A 1 L three-neck flask was fitted with a stirrer and a condenser tube. The flask was then charged with 68.1 g (0.5 mols) of methyltrimethoxysilane, 60.1 g (0.5 mols) of dimethyldimethoxysilane, and 118 g of isobutyl alcohol, and the mixture was cooled in ice with constant stirring. With the temperature inside the system maintained at 0 to 20° C., 54 g of 0.05 N hydrochloric acid solution was added dropwise. Following completion of the dropwise addition, the resulting reaction mixture was stirred for 11 hours at a reflux temperature of 80° C. Subsequently, the resulting reaction liquid was cooled to room temperature, and 150 g of xylene was added to dilute the reaction liquid. This diluted reaction liquid was then poured into a separating funnel, and washed repeatedly with 300 g samples of water until the electrical conductivity of the separated wash water fell to a value of 2.0 μS/cm or lower. The water was then removed from the washed reaction liquid by azeotropic dehydration, and the volatile fraction was adjusted to 30% by mass, thereby yielding 109 g of a solution (that included some organic solvent and had a non-volatile fraction of 70% by mass) of an organopolysiloxane D with a polystyrene equivalent weight average molecular weight of 9,000, represented by a formula (7) shown below:

$$(CH_3)_{1.5}(OX)_{0.28}SiO_{1.11} \quad (7)$$

(wherein, X represents a combination of groups in which the ratio (molar ratio) of hydrogen atoms : methyl groups : isobutyl groups =6.3:1.2:1.2).

Subsequently, the 109 g of the solution of the obtained organopolysiloxane D (that included some organic solvent and had a non-volatile fraction of 70% by mass) and 15.2 g of a polystyrene-based anion exchange resin (product name: Diaion SA10A, manufactured by Mitsubishi Chemical Corporation, moisture content: 43 to 47% by mass) were placed in a flask, and the resulting mixture was reacted by stirring for 72 hours at room temperature. Following completion of this 72 hour reaction, 25 g of xylene was added to the reaction mixture, and the mixture was then filtered, yielding 133 g of a solution (that included some organic solvent and had a non-volatile fraction of 57% by mass) of an organopolysiloxane E with a polystyrene equivalent weight average molecular weight of 80,000, represented by a formula (8) shown below:

$$(CH_3)_{1.5}(OX)_{0.21}SiO_{1.15} \tag{8}$$

(wherein, X represents a combination of groups in which the ratio (molar ratio) of hydrogen atoms : methyl groups : isobutyl groups=5.3:1.1:1.2).

The 133 g of the solution of the obtained organopolysiloxane E (that included some organic solvent and had a non-volatile fraction of 57% by mass), 36 g of triethylamine, and 120 g of xylene were combined in a flask, and with the mixture undergoing constant stirring, 26 g of trimethylsilyl chloride was added dropwise at a temperature of 25 to 60° C. Following completion of the dropwise addition, the resulting mixture was reacted for a further 2 hours at room temperature, and 200 g of water was then added dropwise to the reaction mixture. Subsequently, the reaction mixture was poured into a separating funnel, and the organic phase was separated and then washed repeatedly with 200 g samples of water until the electrical conductivity of the separated wash water fell to a value of 2.0 μS/cm or lower. The water was then removed from the washed reaction liquid by azeotropic dehydration, and the reaction liquid was filtered and stripped of solvent, yielding 70 g of a solution (that included some organic solvent and had a non-volatile fraction of 91% by mass) of a silylated organopolysiloxane F with a polystyrene equivalent weight average molecular weight of 84,000, represented by a formula (9) shown below:

$$(CH_3)_{1.5}(OX)_{0.19}SiO_{1.16} \tag{9}$$

(wherein, X represents a combination of groups in which the ratio (molar ratio) of groups represented by —Si(CH$_3$)$_3$ : methyl groups : isobutyl groups=5.3:1.1:1.1).

Synthesis Example 3

A 1 L three-neck flask was fitted with a stirrer and a condenser tube. The flask was then charged with 136.2 g (1.0 mols) of methyltrimethoxysilane and 106 g of isobutyl alcohol, and the mixture was cooled in ice with constant stirring. With the temperature inside the system maintained at 0 to 20° C., 81 g of 0.05 N hydrochloric acid solution was added dropwise. Following completion of the dropwise addition, the resulting reaction mixture was stirred for 11 hours at a reflux temperature of 80° C. Subsequently, the resulting reaction liquid was cooled to room temperature, and 150 g of xylene was added to dilute the reaction liquid. This diluted reaction liquid was then poured into a separating funnel, and washed repeatedly with 300 g samples of water until the electrical conductivity of the separated wash water fell to a value of 2.0 μS/cm or lower. The water was then removed from the washed reaction liquid by azeotropic dehydration, and the volatile fraction was adjusted to 30% by mass, thereby yielding 105 g of a solution (that included some organic solvent and had a non-volatile fraction of 70% by mass) of an organopolysiloxane G with a polystyrene equivalent weight average molecular weight of 27,000, represented by a formula (10) shown below:

$$(CH_3)_{1.0}(OX)_{0.24}SiO_{1.38} \tag{10}$$

(wherein, X represents a combination of groups in which the ratio (molar ratio) of hydrogen atoms : methyl groups : isobutyl groups=6.5:1.3:1.2).

Subsequently, the 105 g of the solution of the obtained organopolysiloxane G (that included some organic solvent and had a non-volatile fraction of 70% by mass) and 14.7 g of a polystyrene-based anion exchange resin (product name: Diaion SA10A, manufactured by Mitsubishi Chemical Corporation, moisture content: 43 to 47% by mass) were placed in a flask, and the resulting mixture was reacted by stirring for 72 hours at room temperature. Following completion of this 72 hour reaction, 24 g of xylene was added to the reaction mixture, and the mixture was then filtered, yielding 124 g of a solution (that included some organic solvent and had a non-volatile fraction of 57% by mass) of an organopolysiloxane H with a polystyrene equivalent weight average molecular weight of 280,000, represented by a formula (11) shown below:

$$(CH_3)_{1.0}(OX)_{0.12}SiO_{1.44} \tag{11}$$

(wherein, X represents a combination of groups in which the ratio (molar ratio) of hydrogen atoms : methyl groups : isobutyl groups=5.3:1.0:1.1).

The 124 g of the solution of the obtained organopolysiloxane H (that included some organic solvent and had a non-volatile fraction of 57% by mass), 33 g of triethylamine, and 120 g of xylene were combined in a flask, and with the mixture undergoing constant stirring, 24 g of trimethylsilyl chloride was added dropwise at a temperature of 25 to 60° C. Following completion of the dropwise addition, the resulting mixture was reacted for 2 hours at room temperature, and 200 g of water was then added dropwise to the reaction mixture. Subsequently, the reaction mixture was poured into a separating funnel, and the organic phase was separated and then washed repeatedly with 200 g samples of water until the electrical conductivity of the separated wash water fell to a value of 2.0 μS/cm or lower. The water was then removed from the washed reaction liquid by azeotropic dehydration, and the reaction liquid was filtered and stripped of solvent, yielding 69 g of a solution (that included some organic solvent and had a non-volatile fraction of 92% by mass) of a silylated organopolysiloxane I with a polystyrene equivalent weight average molecular weight of 285,000, represented by a formula (12) shown below:

$$(CH_3)_{1.0}(OX)_{0.10}SiO_{1.45} \tag{12}$$

(wherein, X represents a combination of groups in which the ratio (molar ratio) of groups represented by —Si(CH$_3$)$_3$ : methyl groups : isobutyl groups=4.9:1.1:1.0).

Comparative Synthesis Example 1

A 1 L three-neck flask was fitted with a stirrer and a condenser tube. The flask was then charged with 40.9 g (0.3 mols) of methyltrimethoxysilane, 84.1 g (0.7 mols) of dimethyldimethoxysilane, and 113 g of isobutyl alcohol, and the mixture was cooled in ice with constant stirring. With the temperature inside the system maintained at 0 to 20° C., 52 g of 0.05 N hydrochloric acid solution was added dropwise. Following completion of the dropwise addition, the resulting reaction mixture was stirred for 11 hours at a reflux temperature of 80° C. Subsequently, the resulting reaction liquid was cooled to room temperature, and 150 g of xylene was added to dilute the reaction liquid. This diluted reaction liquid was then poured into a separating funnel, and washed repeatedly with 300 g samples of water until the electrical conductivity of the separated wash water fell to a value of 2.0 μS/cm or lower. The water was then removed from the washed reaction liquid by azeotropic dehydration, and the volatile fraction was adjusted to 30% by mass, thereby yielding 108 g of a solution (that included some organic solvent and had a non-volatile fraction of 70% by mass) of an organopolysiloxane J with a polystyrene equivalent weight average molecular weight of 8,600, represented by a formula (13) shown below:

$$(CH_3)_{1.7}(OX)_{0.25}SiO_{1.03} \tag{13}$$

(wherein, X represents a combination of groups in which the ratio (molar ratio) of hydrogen atoms : methyl groups : isobutyl groups=6.6:1.3:1.2).

Subsequently, the 108 g of the solution of the obtained organopolysiloxane J (that included some organic solvent and had a non-volatile fraction of 70% by mass) and 15.1 g of a polystyrene-based anion exchange resin (product name: Diaion SA10A, manufactured by Mitsubishi Chemical Corporation, moisture content: 43 to 47% by mass) were placed in a flask, and the resulting mixture was reacted by stirring for 72 hours at room temperature. Following completion of this 72 hour reaction, 25 g of xylene was added to the reaction mixture, and the mixture was then filtered, yielding 129 g of a solution (that included some organic solvent and had a non-volatile fraction of 57% by mass) of an organopolysiloxane K with a polystyrene equivalent weight average molecular weight of 23,000, represented by a formula (14) shown below:

$$(CH_3)_{1.7}(OX)_{0.22}SiO_{1.04} \tag{14}$$

(wherein, X represents a combination of groups in which the ratio (molar ratio) of hydrogen atoms : methyl groups : isobutyl groups=6.1:1.2:1.2).

The 129 g of the solution of the obtained organopolysiloxane K (that included some organic solvent and had a non-volatile fraction of 57% by mass), 33 g of triethylamine, and 120 g of xylene were combined in a flask, and with the mixture undergoing constant stirring, 24 g of trimethylsilyl chloride was added dropwise at a temperature of 25 to 60° C. Following completion of the dropwise addition, the resulting mixture was reacted for 2 hours at room temperature, and 200 g of water was then added dropwise to the reaction mixture. Subsequently, the reaction mixture was poured into a separating funnel, and the organic phase was separated and then washed repeatedly with 200 g samples of water until the electrical conductivity of the separated wash water fell to a value of 2.0 μS/cm or lower. The water was then removed from the washed reaction liquid by azeotropic dehydration, and the reaction liquid was filtered and stripped of solvent, yielding 70 g of a solution (that included some organic solvent and had a non-volatile fraction of 92% by mass) of a silylated organopolysiloxane L with a polystyrene equivalent weight average molecular weight of 23,500, represented by a formula (15) shown below:

$$(CH_3)_{1.7}(OX)_{0.21}SiO_{1.05} \tag{15}$$

(wherein, X represents a combination of groups in which the ratio (molar ratio) of groups represented by —Si(CH$_3$)$_3$ : methyl groups : isobutyl groups=5.9:1.2:1.1).

Comparative Synthesis Example 2

A 1 L three-neck flask was fitted with a stirrer and a condenser tube. The flask was then charged with 40.9 g (0.3 mols) of methyltrimethoxysilane, 170.8 g (0.7 mols) of diphenyldimethoxysilane, and 106 g of isobutyl alcohol, and the mixture was cooled in ice with constant stirring. With the temperature inside the system maintained at 0 to 20° C., 55.1 g of 0.05 N hydrochloric acid solution was added dropwise. Following completion of the dropwise addition, the resulting reaction mixture was stirred for 11 hours at a reflux temperature of 80° C. Subsequently, 150 g of xylene was added to dilute the reaction liquid. This diluted reaction liquid was then poured into a separating funnel, and washed repeatedly with 300 g samples of water until the electrical conductivity of the separated wash water fell to a value of 2.0 μS/cm or lower. The water was then removed from the washed reaction liquid by azeotropic dehydration, and the volatile fraction was adjusted to 30% by mass, thereby yielding 124 g of a solution (that included some organic solvent and had a non-volatile fraction of 70% by mass) of an organopolysiloxane M with a polystyrene equivalent weight average molecular weight of 6,700, represented by a formula (16) shown below:

$$(CH_3)_{0.3}(C_6H_5)_{1.4}(OX)_{0.26}SiO_{1.02} \tag{16}$$

(wherein, X represents a combination of groups in which the ratio (molar ratio) of hydrogen atoms : methyl groups : isobutyl groups=6.3:1.1:1.2).

Subsequently, the 124 g of the solution of the obtained organopolysiloxane M (that included some organic solvent and had a non-volatile fraction of 70% by mass) and 17.4 g of a polystyrene-based anion exchange resin (product name: Diaion SA10A, manufactured by Mitsubishi Chemical Corporation, moisture content: 43 to 47% by mass) were placed in a flask, and the resulting mixture was reacted by stirring for 72 hours at room temperature. Following completion of this 72 hour reaction, 25 g of xylene was added to the reaction mixture, and the mixture was then filtered, yielding 142 g of a solution (that included some organic solvent and had a non-volatile fraction of 57% by mass) of an organopolysiloxane N with a polystyrene equivalent weight average molecular weight of 19,000, represented by a formula (17) shown below:

$$(CH_3)_{0.3}(C_6H_5)_{1.4}(OX)_{0.21}SiO_{1.05} \tag{17}$$

(wherein, X represents a combination of groups in which the ratio (molar ratio) of hydrogen atoms : methyl groups: isobutyl groups=6.1:1.1:1.1).

The 142 g of the solution of the obtained organopolysiloxane N (that included some organic solvent and had a non-volatile fraction of 57% by mass), 39 g of triethylamine, and 120 g of xylene were combined in a flask, and with the mixture undergoing constant stirring, 28 g of trimethylsilyl chloride was added dropwise at a temperature of 25 to 60° C. Following completion of the dropwise addition, the resulting mixture was reacted for 2 hours at room temperature, and 200 g of water was then added dropwise to the reaction mixture. Subsequently, the reaction mixture was poured into a separating funnel, and the organic phase was separated and then washed repeatedly with 200 g samples of water until the electrical conductivity of the separated wash water fell to a value of 2.0 μS/cm or lower. The water was then removed from the washed reaction liquid by azeotropic dehydration, and the reaction liquid was filtered and stripped of solvent, yielding 78 g of a solution (that included some organic solvent and had a non-volatile fraction of 92% by mass) of a silylated organopolysiloxane O with a polystyrene equivalent weight average molecular weight of 19,500, represented by a formula (18) shown below:

$$(CH_3)_{0.3}(C_6H_5)_{1.4}(OX)_{0.20}SiO_{1.05} \tag{18}$$

(wherein, X represents a combination of groups in which the ratio (molar ratio) of groups represented by —Si(CH₃)₃: methyl groups : isobutyl groups=5.8:1.1:1.0).

Examples 1 to 3, Comparative Examples 1 to 4

The organopolysiloxanes or silylated organopolysiloxanes produced in the synthesis examples 1 to 3 and the comparative synthesis examples 1 and 2 were combined with the condensation catalyst aluminum acetylacetonate, using the compounds and blend quantities shown in Table 1. The resulting compositions were then cured in accordance with the evaluation methods described below, and the resulting cured products (coatings) were evaluated for crack resistance, adhesion, heat resistance, storage stability, and external appearance. A UV irradiation test was also conducted. The results obtained are shown in Table 1.

Evaluation Methods

1. Crack Resistance

The composition was placed in a Teflon (registered trademark) coated mold of dimensions length: 50 mm×width: 50 mm×depth: 2 mm, and subsequently subjected to a stepwise curing process that involved heating at 60° C. for 1 hour, heating at 100° C. for 1 hour, and then heating at 150° C. for 4 hours, thus yielding a cured film with a thickness of 1 mm. The cured film was inspected visually for the presence of cracks. If no cracks were visible in the cured film, the crack resistance was evaluated as "good", and was recorded as "A", whereas if cracks were detected, the resistance was evaluated as "poor", and was recorded as "B". Furthermore, if a cured film could not be formed, an evaluation of "measurement impossible" was recorded as "C".

2. Adhesion

The composition was applied to a glass substrate using an immersion method, and subsequently subjected to a stepwise curing process that involved heating at 60° C. for 1 hour, heating at 100° C. for 1 hour, and then heating at 150° C. for 4 hours, thus forming a cured film with a thickness of 2 to 3 μm on top of the glass substrate. Using a cross-cut adhesion test, the adhesion of this cured film to the glass substrate was investigated. Those cases where the presence of cracking made measurement of the adhesion impossible were recorded in the table using the symbol "x".

3. Heat Resistance

The composition was placed in a Teflon (registered trademark) coated mold of dimensions length: 50 mm×width: 50 mm×depth: 2 mm, and subsequently subjected to a stepwise curing process that involved heating at 60° C. for 1 hour, heating at 100° C. for 1 hour, and then heating at 150° C. for 4 hours, thus yielding a cured film of thickness 1 mm. The mass of this cured film was then measured. This cured film was then placed in an oven at 250° C., and the mass was re-measured after 500 hours in the oven. The ratio of the mass of the cured film following 500 hours in the oven relative to the mass of the cured film immediately following preparation was determined, and was reported as the residual mass ratio (%). The heat resistance was evaluated as being more favorable the closer this value was to 100%. Those cases where a cured film could not be formed were recorded in the table using the symbol "x".

4. External Appearance of the Cured Product

The composition was placed in a Teflon (registered trademark) coated mold of dimensions length: 50 mm×width: 50 mm×depth: 300 μtm, and subsequently subjected to a stepwise curing process that involved heating at 60° C. for 1 hour, heating at 100° C. for 1 hour, and then heating at 150° C. for 4 hours, thus yielding a cured film of thickness 200 μm. The surface of this cured film was inspected visually. If cracks were noticeable, then the surface within the non-cracked portions was evaluated.

5. UV Irradiation Test 0.1 g of the composition was dripped onto a glass substrate using a dropper, and was then subjected to a stepwise curing process that involved heating at 60° C. for 1 hour, heating at 100° C. for 1 hour, and then heating at 150° C. for 4 hours, thus forming a cured product on top of the glass substrate. This cured product was then irradiated with UV light (30 mW) for 24 hours using a UV irradiation device (product name: Eye Ultraviolet Curing Apparatus, manufactured by Eyegraphics Co., Ltd.). The surface of the cured product following UV light irradiation was then inspected visually. If absolutely no deterioration of the cured product surface was noticeable, the UV resistance was evaluated as "good", and was recorded as "A", if slight deterioration was noticeable, the UV resistance was evaluated as "fair", and was recorded as "B", and if significant deterioration was noticeable, the UV resistance was evaluated as "poor", and was recorded as "C".

6. Storage Stability

The composition was stored at 25° C., and the state of the composition after storage for 12 hours was inspected visually. If absolutely no change in viscosity was noticeable, then the storage stability was evaluated as "good", and was recorded as "A", if a slight change in viscosity was noticeable, the storage stability was evaluated as "fair", and was recorded as "B", and if the composition had gelled, the storage stability was evaluated as "poor", and was recorded as "C".

TABLE 1

| | Examples | | | Comparative examples | | | |
|---|---|---|---|---|---|---|---|
| | 1 | 2 | 3 | 1 | 2 | 3 | 4 |
| Silylated organopolysiloxane C | 10 | — | — | — | — | — | — |
| Silylated organopolysiloxane F | — | 10 | — | — | — | — | — |
| Silylated organopolysiloxane I | — | — | 10 | — | — | — | — |
| Organopolysiloxane A | — | — | — | 13.1 | — | — | — |
| Organopolysiloxane B | — | — | — | — | 16.1 | — | — |
| Silylated organopolysiloxane L | — | — | — | — | — | 10 | — |
| Silylated organopolysiloxane O | — | — | — | — | — | — | 10 |
| Aluminum acetylacetonate | 0.05 | 0.05 | 0.05 | 0.05 | 0.05 | 0.05 | 0.05 |
| *1 Methyl group content (%) | 26.3 | 31.9 | 22.3 | 26.3 | 26.3 | 35.5 | 2.8 |
| *2 Existence of phenyl groups | No | No | No | No | No | No | Yes |
| Weight average molecular weight | 220,000 | 84,000 | 285,000 | 24,000 | 210,000 | 23,500 | 19,500 |
| Crack resistance | A | A | A | B | A | C | B |
| Adhesion | 100/100 | 100/100 | 100/100 | 30/100 | 100/100 | x | 10/100 |

TABLE 1-continued

| | Examples | | | Comparative examples | | | |
|---|---|---|---|---|---|---|---|
| | 1 | 2 | 3 | 1 | 2 | 3 | 4 |
| Heat resistance [residual mass ratio (%)] | 96 | 87 | 98 | 91 | 95 | x | 89 |
| Cured product external appearance | colorless transparent | colorless transparent | colorless transparent | colorless transparent | colorless transparent | colorless transparent | colorless transparent |
| UV irradiation test | A | A | A | A | A | B | C |
| Storage stability | A | A | A | B | C | A | A |

(units: parts by mass)
* The blend quantities of the organopolysiloxanes and the silylated organopolysiloxanes shown in the table represent quantities for the non-volatile fraction and do not include the organic solvent.
*1 Methyl group content: the theoretical quantity of methyl groups within the organopolysiloxane or silylated organopolysiloxane containing no organic solvent (that is, the non-volatile fraction).
*2 Whether or not phenyl groups exist within the organopolysiloxane or silylated organopolysiloxane.

What is claimed is:

1. A resin composition for sealing an optical device, comprising:
   (i) a silylated organopolysiloxane with a polystyrene equivalent weight average molecular weight of $5\times10^4$ or greater, represented by an average composition formula (1) shown below:

$$R^1_a(OX)_bSiO_{(4-a-b)/2} \quad (1)$$

(wherein, each $R^1$ represents, independently, an alkyl group of 1 to 6 carbon atoms, an alkenyl group of 1 to 6 carbon atoms, or an aryl group of 1 to 6 carbon atoms; X represents a combination of a group represented by a formula —$SiR^2R^3R^4$ (wherein, $R^2$, $R^3$ and $R^4$ each represent, independently, an unsubstituted or substituted monovalent hydrocarbon group), and one or more groups selected from amongst alkyl groups, alkenyl groups, alkoxyalkyl groups and acyl groups of 1 to 6 carbon atoms; a represents a number within a range from 1.00 to 1.5; and a+b satisfies 1.00<a+b<2), and
   (ii) a condensation catalyst.

2. The composition according to claim 1, wherein said $R^2$, $R^3$ and $R^4$ groups are methyl groups.

3. The composition according to claim 1, wherein said $R^1$ is an alkyl group of 1 to 6 carbon atoms.

4. The composition according to claim 2, wherein said $R^1$ is an alkyl group of 1 to 6 carbon atoms.

5. The composition according to claim 3, wherein said $R^1$ is a methyl group.

6. The composition according to claim 4, wherein said $R^1$ is a methyl group.

7. The composition according to claim 1, wherein a proportion of said $R^1$ group within said silylated organopolysiloxane (i) is no more than 32% by mass.

8. The composition according to claim 1, wherein said condensation catalyst (ii) is an organometallic catalyst.

9. The composition according to claim 8, wherein said organometallic catalyst comprises atoms of one or more elements selected from the group consisting of tin, zinc, aluminum and titanium.

10. The composition according to claim 9, wherein said organometallic catalyst is an aluminum chelate compound.

11. The composition according to claim 10, wherein said aluminum chelate compound is an acetylacetone-modified aluminum compound.

12. A transparent cured product obtained by curing the composition according to claim 1.

13. A transparent cured product with a thickness of 10 μm to 3 mm, obtained by curing the composition according to claim 1 at a temperature of 100° C. or higher.

14. A method of sealing a semiconductor element, comprising the steps of: applying the composition according to claim 1 to a semiconductor element, and curing said composition that has been applied to said semiconductor element.

15. A resin-sealed semiconductor device, comprising a semiconductor element, and a cured product of the composition according to claim 1 that seals said semiconductor element.

* * * * *